United States Patent
Rousset et al.

(10) Patent No.: US 12,381,056 B2
(45) Date of Patent: Aug. 5, 2025

(54) ELECTROMECHANICAL SWITCHING DEVICE FOR AN ELECTRIC POWER CIRCUIT COMPRISING AT LEAST ONE SYSTEM FOR DETECTING THE CONTACT OR NON-CONTACT POSITION OF A BLADE OF A CONTACTOR

(71) Applicant: Airbus Operations SAS, Toulouse (FR)

(72) Inventors: David Rousset, Toulouse (FR); Jean-Marc Lacoste, Toulouse (FR)

(73) Assignee: Airbus Operations SAS, Toulouse (FR)

( * ) Notice: Subject to any disclaimer, the term of this patent is extended or adjusted under 35 U.S.C. 154(b) by 435 days.

(21) Appl. No.: 17/993,149

(22) Filed: Nov. 23, 2022

(65) Prior Publication Data

US 2023/0170171 A1 Jun. 1, 2023

(30) Foreign Application Priority Data

Nov. 29, 2021 (FR) ...................................... 2112621

(51) Int. Cl.
*H01H 47/04* (2006.01)
*G01R 19/00* (2006.01)
(Continued)

(52) U.S. Cl.
CPC ......... *H01H 47/04* (2013.01); *G01R 19/0084* (2013.01); *H01F 7/1844* (2013.01); *H01H 47/002* (2013.01); *H01H 50/54* (2013.01)

(58) Field of Classification Search
CPC ...... H01H 47/04; H01H 47/002; H01H 50/54; H01H 1/50; H01H 2047/006;
(Continued)

(56) References Cited

U.S. PATENT DOCUMENTS

| 5,040,089 A | * | 8/1991 | Sasaki | ................... | H01H 47/06 219/722 |
| 5,734,309 A | * | 3/1998 | Schmitz | ................ | H01F 7/1638 335/177 |

(Continued)

FOREIGN PATENT DOCUMENTS

| EP | 2210262 B1 | 10/2015 | | |
| EP | 3971927 A1 | * 3/2022 | ......... | G01R 31/3278 |

(Continued)

OTHER PUBLICATIONS

French Search Report dated Jun. 14, 2022; priority document.

*Primary Examiner* — Dharti H Patel
(74) *Attorney, Agent, or Firm* — Greer, Burns & Crain, Ltd.

(57) ABSTRACT

A switching device includes at least one main contactor, a control power supply and an actuator configured to cause the main contactor to change from an open to a closed state against a force generated by the spring. The contactor has a blade and at least one terminal, the blade being configured to assume a position in contact with the terminal and a position not in contact with the terminal. The switching device includes a detection system configured to determine the contact or non-contact blade position of the main contactor, to generate at least one second signal as a function of the determined blade position of the main contactor and to transmit the second signal to the control power supply. The control power supply is configured to generate a control signal configured to keep the main contactor in the closed state upon reception of the second signal.

11 Claims, 2 Drawing Sheets

(51) Int. Cl.
*H01F 7/18* (2006.01)
*H01H 47/00* (2006.01)
*H01H 50/54* (2006.01)

(58) Field of Classification Search
CPC ............. H01H 2047/008; H01H 47/22; H01H 50/541; H01H 50/08; G01R 19/0084; G01R 19/16533; H01F 7/1844; G01B 21/02
USPC .......................................... 361/139
See application file for complete search history.

(56) References Cited

U.S. PATENT DOCUMENTS

| | | | |
|---|---|---|---|
| 5,761,018 A * | 6/1998 | Blakely | H02H 3/083 |
| | | | 361/103 |
| 5,784,245 A | 7/1998 | Moraghan et al. | |
| 6,066,999 A * | 5/2000 | Pischinger | H01F 7/088 |
| | | | 335/226 |
| 2006/0098375 A1* | 5/2006 | Lluch | H01H 47/325 |
| | | | 361/139 |
| 2010/0302700 A1* | 12/2010 | Kellis | H02H 3/0935 |
| | | | 361/109 |
| 2012/0235475 A1* | 9/2012 | Iwata | H01H 9/547 |
| | | | 307/10.1 |
| 2012/0279839 A1* | 11/2012 | Iwata | H01H 47/002 |
| | | | 200/308 |
| 2014/0002945 A1* | 1/2014 | Kodama | H01H 47/002 |
| | | | 361/160 |
| 2015/0055269 A1* | 2/2015 | Kim | H01H 47/22 |
| | | | 361/170 |
| 2020/0079222 A1* | 3/2020 | Tabatowski-Bush | B60L 58/21 |
| 2021/0170899 A1* | 6/2021 | Wang | B60L 3/04 |
| 2023/0335359 A1* | 10/2023 | Johansson | H01H 1/0015 |

FOREIGN PATENT DOCUMENTS

| | | | | |
|---|---|---|---|---|
| FR | 2607318 | A1 | 5/1988 | |
| FR | 3103328 | A1 * | 5/2021 | ............ B60L 3/0092 |
| WO | 9824106 | A1 | 6/1998 | |

* cited by examiner

ELECTROMECHANICAL SWITCHING DEVICE FOR AN ELECTRIC POWER CIRCUIT COMPRISING AT LEAST ONE SYSTEM FOR DETECTING THE CONTACT OR NON-CONTACT POSITION OF A BLADE OF A CONTACTOR

CROSS-REFERENCES TO RELATED APPLICATIONS

This application claims the benefit of the French patent application No. 2112621 filed on Nov. 29, 2021, the entire disclosures of which are incorporated herein by way of reference.

FIELD OF THE INVENTION

The present application relates to an electromagnetic switching device for an electric power circuit comprising at least one system for detecting the contact or non-contact position of a blade of a contactor.

BACKGROUND OF THE INVENTION

According to one embodiment shown in FIG. 1, a switching device 10 of an electric power circuit comprises:
- at least one main contactor 12 configured to assume an open state, in which it isolates an electric source 14 and an electric load 16 from the electric power circuit, and a closed state, in which it connects the electric source 14 and the electric load 16;
- a coil 18 configured to cause the main contactor 12 to close and to be kept in the closed state when the coil 18 is powered;
- a spring 20 configured to cause the main contactor 12 to open and to be kept in the open state when the coil 18 is no longer powered;
- a control power supply 22 configured to apply a control signal Sc to the first and second end terminals 18.1, 18.2 of the coil 18 upon reception of a signal 24 and to maintain this control signal Sc as long as the main contactor 12 has to remain in the closed state.

Such an electromechanical switching device is suitable for voltages of the order of 115 V for the electric power circuit, below 300 V, and is not suitable for higher voltages, of the order of 1,000 V. At these voltages, short-circuit currents reaching several kiloamperes can occur and generate "levitation" phenomena that tend to initiate the opening of the main contactor 12 despite the action of the coil 18. This unwanted opening of the main contactor 12 causes electric arcing that can lead to the partial or complete degradation thereof.

SUMMARY OF THE INVENTION

The present invention aims to address all or some of the disadvantages of the prior art.

To this end, the aim of the invention is a switching device comprising at least one main contactor and an upstream section and a downstream section of an electric power circuit positioned on either side of the main contactor, the main contactor being configured to assume open and closed states, the switching device comprising a spring, a control power supply and an actuator configured to cause the main contactor to change from the open state to the closed state against a force generated by the spring when the actuator is powered by a control signal generated by the control power supply that is equal to a first level, the spring being arranged so as to cause the main contactor to change from the closed state to the open state when the actuator is not powered, the main contactor comprising a blade and at least one terminal, the blade being configured to assume a position in contact with the terminal and a position not in contact with the terminal.

According to the invention, the switching device comprises a detection system configured to determine the contact or non-contact position of the blade of the main contactor, to generate at least one second signal as a function of the determined position of the blade of the main contactor and to transmit the second signal to the control power supply. In addition, the control power supply is configured to generate a control signal intended to keep the main contactor in the closed state upon reception of the second signal. In addition, the control power supply is configured so that the control signal is equal to the first level for a first given duration starting from the reception of a first signal and then to a second level, lower than the first level, in order to keep the main contactor in the closed state as long as the main contactor has to be kept in the closed state, and to a third level higher than the second level upon reception of the second signal transmitted by the detection system.

This solution allows, in a simple and effective manner, levitation phenomena to be detected and counteracted by increasing the force exerted by the actuator on the main contactor in order to keep it in the closed state.

According to another feature, the control signal is maintained at the third level as long as the detection system determines that the blade is in the non-contact position.

According to another feature, the third level is greater than or equal to the first level.

According to a first embodiment, the main contactor comprises a terminal or first and second terminals. In addition, the detection system comprises at least one voltage measurement sensor configured to measure a voltage between the blade and at least one of the first and second terminals or between the first and second terminals.

According to another feature, the voltage measurement sensor is configured to transmit a second signal to the control power supply when the measured voltage is greater than a given voltage threshold.

According to another feature, the voltage measurement sensor is configured to continuously transmit a second signal to the control power supply as soon as the measured voltage is greater than the given voltage threshold and until the measured voltage drops below or is equal to the given voltage threshold.

According to another embodiment, the detection system comprises at least one secondary contactor connected to the blade of the main contactor, and a secondary circuit comprising the secondary contactor, with the secondary contactor being configured to assume a closed state when the blade of the main contactor is in the contact position and an open state when the blade of the main contactor is in the non-contact position, the secondary circuit being configured to generate a second signal when the secondary contactor is in the open state.

According to another embodiment, the detection system comprises at least one distance measurement sensor configured to measure a distance separating the distance measurement sensor and the blade.

According to another feature, the distance measurement sensor and the blade are separated by a given distance when the blade is in the contact position, with the distance measurement sensor being configured to transmit a second signal to the control power supply when a difference between the measured distance and the given distance is greater than a given distance threshold.

According to another feature, the distance measurement sensor is configured to continuously transmit a second signal to the control power supply as soon as the difference between the measured distance and the given distance is greater than the given distance threshold and until the difference between the measured distance and the given distance drops below or is equal to the given distance threshold.

According to another feature, the electric power circuit comprises a current limiting system configured to act as a function of the position of the blade determined by the detection system.

BRIEF DESCRIPTION OF THE DRAWINGS

Further features and advantages will become apparent from the following description of the invention, which is provided solely by way of an example, with reference to the accompanying drawings, in which.

DETAILED DESCRIPTION OF THE PREFERRED EMBODIMENTS

Figure 1:
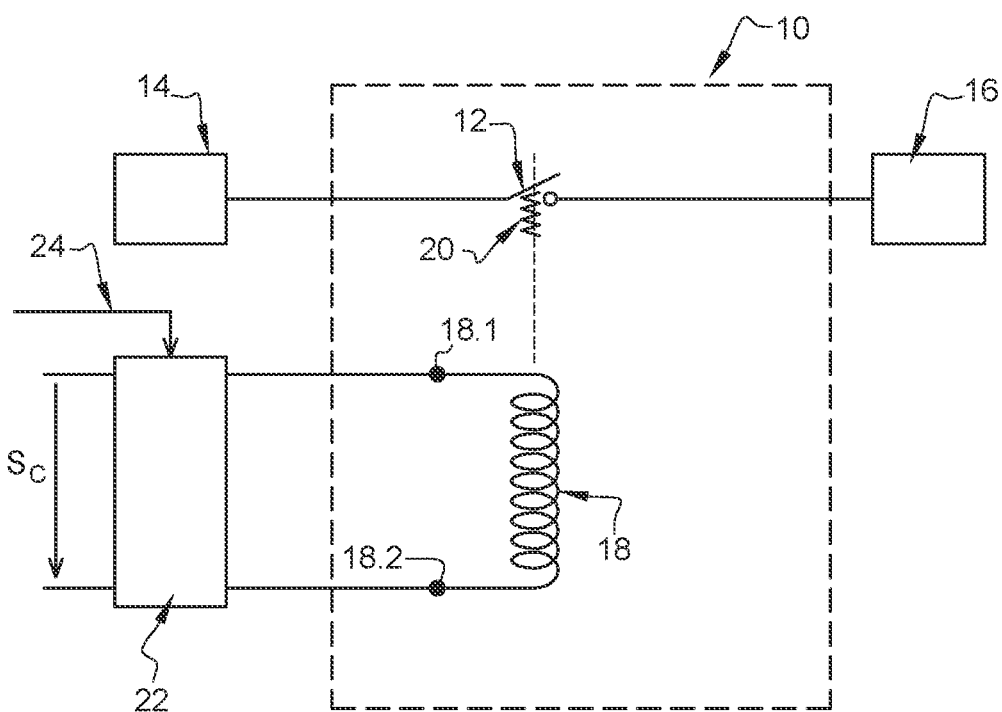
FIG. 1 is a diagram of a switching device for an electric power circuit showing an embodiment of the prior art.
Figure 2:
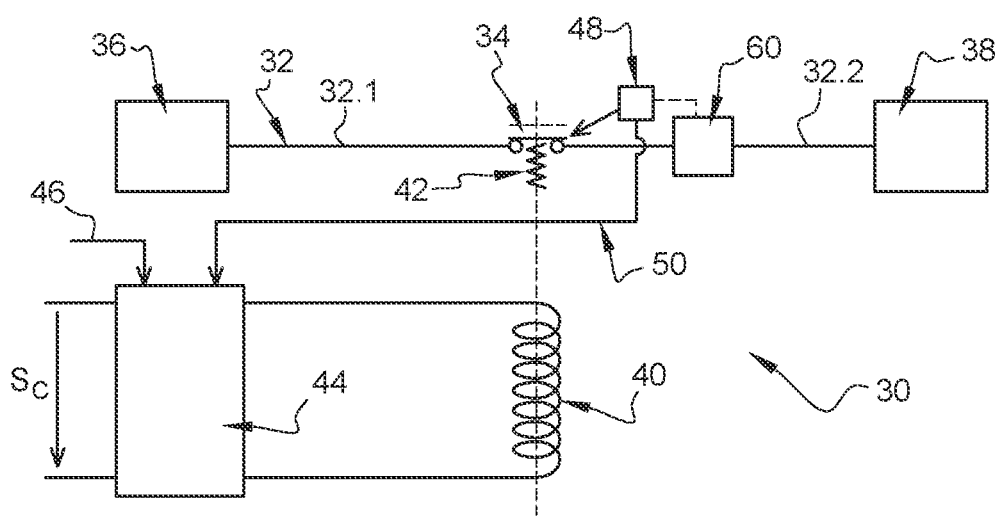
FIG. 2 is a diagram of a switching device for an electric power circuit showing an embodiment of the invention.

In FIG. 2, a switching device 30 for an electric power circuit 32 comprises at least one main contactor 34 and an upstream section 32.1 and a downstream section 32.2 of the electric power circuit 32 positioned on either side of the main contactor 34. The main contactor 34 is configured to assume an open state (shown as dashed lines), in which it isolates the upstream section 32.1 from the downstream section 32.2 and prevents the passage of a current, as well as a closed state, in which it connects the upstream and downstream sections 32.1, 32.2 and allows the passage of a current. According to a non-limiting application, the main contactor 34 is used to connect or isolate at least one electric source 36 and at least one electric load 38 in an electric power circuit of an aircraft. The main contactor 34 is configured to operate at high voltages, above 300 V, of the order of 1,000 V. Of course, it could operate at lower voltages of the order of 115 V.

The switching device 30 comprises:
- an actuator 40 configured to cause the main contactor 34 to close and to be kept in the closed state when the actuator is powered;
- a spring 42 configured to cause the main contactor 34 to open and to be kept in the open state when the actuator 40 is no longer powered;
- a control power supply 44 configured to apply a control signal Sc to the actuator 40 upon reception of a first signal 46 and to maintain this control signal Sc as long as the main contactor 34 has to remain in the closed state.

The control signal Sc can be energy, a voltage, an intensity or any other physical quantity.

According to one embodiment, the actuator 40 is a coil comprising first and second end terminals to which the control signal Sc is applied.

Irrespective of the embodiment, the actuator 40 is configured to cause the main contactor 34 to change from the open state to the closed state against a force generated by the spring 42 when the actuator 40 is powered by a control signal Sc at a first level, with the spring 42 causing the main contactor 34 to change from the closed state to the open state when the actuator 40 is not powered.

The actuator 40 can be used to control the state of a plurality of main contactors 34.

According to one embodiment, the spring 42 is configured so that a retention force exerted by the actuator 40 in order to keep it compressed is less than a switching force exerted by the actuator 40 in order to cause it to compress.

Thus, the actuator 40, urged by the control signal Sc at a first level, exerts a switching force in order to cause the main contactor 34 to change state that is greater than a force for keeping the main contactor 34 in a given state when the actuator 40 is urged by the control signal Sc at a second level, lower than the first level.

The control power supply 44 is configured to generate a control signal Sc equal to:
- a first level for a first given duration starting from the reception of the first signal 46 in order to cause the main contactor 34 to change state (transition from the open state to the closed state);
- a second level, lower than the first level, for keeping the main contactor 34 in the closed state as long as the main contactor 34 has to be kept in the closed state.

Figure 3:
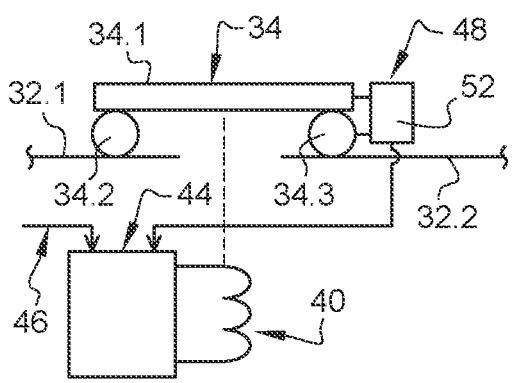
FIG. 3 is a diagram of a system for detecting the state of the blade of a contactor showing a first embodiment, with the blade being in the contact position.
Figure 4:
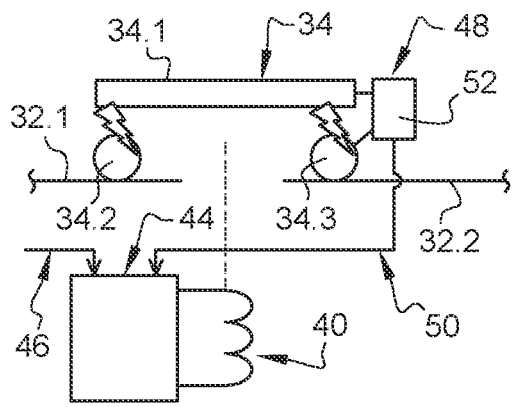
FIG. 4 is a diagram of the detection system shown in FIG. 3, with the blade being in the non-contact position.
Figure 5:
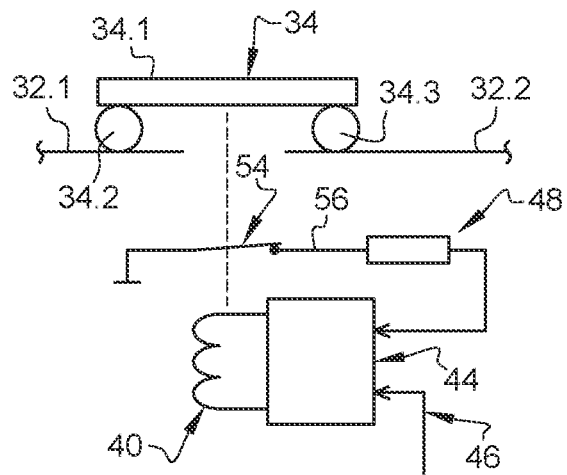
FIG. 5 is a diagram of a system for detecting the state of the blade of a contactor showing a second embodiment, with the blade being in the contact position.
Figure 6:
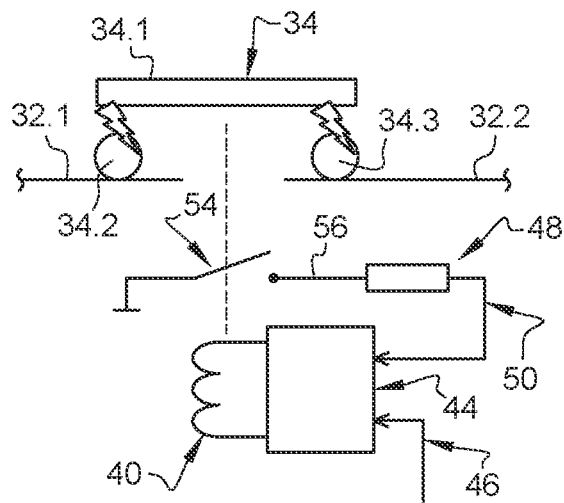
FIG. 6 is a diagram of the detection system shown in FIG. 5, with the blade being in the non-contact position.
Figure 7:
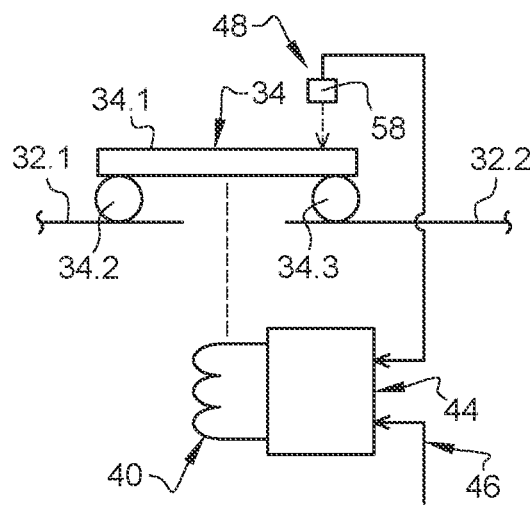
FIG. 7 is a diagram of a system for detecting the state of the blade of a contactor showing a third embodiment, with the blade being in the contact position.
Figure 8:
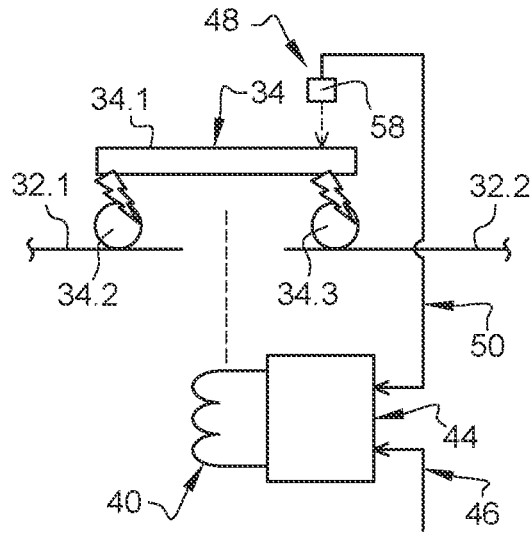
FIG. 8 is a diagram of the detection system shown in FIG. 7, with the blade in the non-contact position.

According to one embodiment that is shown in detail in FIGS. 3 to 8, the main contactor 34 comprises a blade 34.1 and first and second terminals 34.2, 34.3 respectively connected to the upstream and downstream sections 32.1, 32.2, with the blade 34.1 simultaneously being in contact with the first and second terminals 34.2, 34.3 when the main contactor 34 is in the closed state, as shown in FIGS. 3, 5 and 7, the blade 34.1 being spaced apart from at least one of the first and second terminals 34.2, 34.3 when the main contactor 34 is in the open state, as shown in FIGS. 4, 6 and 8.

According to another embodiment, the main contactor 34 comprises a pivoting blade permanently connected to a first section from among the upstream and downstream sections 32.1, 32.2 and a terminal connected to a second section, different from the first section, from among the upstream and downstream sections 32.1, 32.2, with the blade being in contact with the terminal when the main contactor 34 is in the closed state and being spaced apart from the terminal when the main contactor 34 is in the open state.

Irrespective of the embodiment, the main contactor 34 comprises a blade 34.1 and at least one terminal 34.2, with the blade 34.1 being configured to assume a position in contact with the terminal 34.2 when the main contactor 34 is in the closed state and a position spaced apart from the terminal when the main contactor 34 is in the open state.

During operation, a nominal current not exceeding an operating threshold of the order of several hundred amperes circulates through the electric power circuit 32. Under certain circumstances, a short-circuit current exceeding the operating threshold, of the order of several kiloamperes, can circulate in the electric power circuit 32.

This short circuit current can generate "levitation" phenomena that tend to initiate the opening of the main contactor 34 despite the action of the actuator 40. In this situation, the blade 34.1 of the main contactor 34 is in the non-contact position while the actuator 40 is configured to keep the main contactor 34 in the closed state.

The switching device 30 comprises a detection system 48 configured to determine the contact or non-contact position of the blade 34.1 of the main contactor 34, to generate at least one second signal 50 as a function of the determined position (contact or non-contact) of the blade 34.1 of the main contactor 34, and to transmit the second signal 50 to the control power supply 44.

The control power supply 44 is configured to generate a control signal Sc equal to a third level, higher than the second level, applied to the actuator 40 upon reception of the second signal 50 transmitted by the detection system 48 in order to keep the main contactor 34 in the closed state. More specifically, the actuator 40 exerts a greater force on the blade 34.1 in order to keep it pressed against the first and second terminals 34.2, 34.3.

According to one configuration, the third level is greater than or equal to the first level.

The control signal Sc is kept at the third level as long as the detection system 48 determines that the blade 34.1 is in the non-contact position. When the detection system 48 determines that the blade 34.1 has returned to the contact position, the control signal Sc is again at the second level.

According to a first embodiment shown in FIGS. 3 and 4, the detection system 48 comprises at least one voltage measurement sensor 52, such as a voltmeter, for example, configured to measure a voltage between the blade 34.1 and at least one of the first and second terminals 34.2, 34.3 or between the first and second terminals 34.2, 34.3. According to a first configuration, the voltage measurement sensor 52 comprises a first connector connected to the blade 34.1 and a second connector connected to one of the first or second terminals 34.2, 34.3, in particular the one where the blade 34.1 separates as a priority in case of levitation phenomena.

According to a second configuration, the detection system 48 comprises a first voltage measurement sensor having a first connector connected to the blade 34.1 and a second connector connected to the first terminal 34.2, and a second voltage measurement sensor having a first connector connected to the blade 34.1 and a second connector connected to the second terminal 34.3.

According to another configuration, the voltage measurement sensor 52 is connected to the first and second terminals 34.2, 34.3.

During operation, the voltage measured by each voltage measurement sensor 52 is zero or practically zero when the blade 34.1 is in the contact position, as shown in FIG. 3, and is higher than a given, non-zero, voltage threshold when the blade 34.1 is in the non-contact position, as shown in FIG. 4, when a levitation phenomenon occurs. In addition, each voltage measurement sensor 52 is configured to transmit a second signal 50 to the control power supply 44 when the measured voltage is greater than the given voltage threshold. According to one configuration, each voltage measurement sensor 52 is configured to continuously transmit a second signal 50 to the control power supply 44 as soon as the measured voltage is greater than the given voltage threshold and until the measured voltage drops below or is equal to the given voltage threshold.

According to a second embodiment shown in FIGS. 5 and 6, the detection system 48 comprises at least one secondary contactor 54 connected to the main contactor 34, more specifically to its blade 34.1, and provided on a secondary circuit 56. The secondary contactor 54 is configured to assume a closed state when the blade 34.1 of the main contactor 34 is in the contact position and an open state when the blade 34.1 of the main contactor 34 is in the non-contact position.

The secondary circuit 56 is configured to generate a second signal 50 when the secondary contactor 54 is in the open state. According to one configuration, the secondary circuit 56 generates a second signal 50 when the secondary contactor 54 is in the open state, as shown in FIG. 6, which corresponds to the non-contact position of the main contactor 34, and no signal or a signal different from the second signal 50 when the secondary contactor 54 is in the closed state, as shown in FIG. 5, which corresponds to the contact position of the main contactor 34.

According to a third embodiment shown in FIGS. 7 and 8, the detection system 48 comprises at least one distance measurement sensor 58 configured to measure a distance separating the sensor 58 and the blade 34.1. This distance measurement sensor 58 is appropriately positioned in line with an area of the blade 34.1 that moves in case of levitation phenomena.

During operation, the distance measured by each distance measurement sensor 58 is equal to a given distance when the blade 34.1 is in the contact position, as shown in FIG. 7, and is different from the given distance when the blade 34.1 is in the non-contact position, as shown in FIG. 8, when a levitation phenomenon occurs. In addition, each distance measurement sensor 58 is configured to transmit a second signal 50 to the control power supply 44 when the difference between the measured distance and the given distance is greater than a given distance threshold, which can be zero. According to one configuration, each distance measurement sensor 58 is configured to continuously transmit a second signal 50 to the control power supply 44 as soon as the difference between the measured distance and the given distance is greater than the given distance threshold and until the difference between the measured distance and the given distance drops below or is equal to the given distance threshold.

Of course, the invention is not limited to the voltage or distance measurement sensors 52, 58 or to the secondary contactor 54 for determining the contact or non-contact position of the blade 34.1 of the main contactor 34.

As described in document EP 2210262, the control power supply 44 can comprise a control circuit connecting an intermediate terminal of the coil and the second end terminal of the coil, the control circuit comprising an auxiliary contactor configured to alternately assume open and closed states controlled by the coil and a resettable current limiting system, with the main and auxiliary contactors being configured to switch simultaneously.

According to an embodiment shown in FIG. 2, the electric power circuit 32 comprises a current limiting system 60 configured to act as a function of the position of the blade 34.1, as determined by the detection system 48. Thus, the current limiting system 60 is configured to assume a deactivated state as long as the detection system 48 determines that the blade 34.1 is in the contact position and an activated state when the detection system 48 determines that the blade

34.1 is in the non-contact position due to a levitation phenomenon. In the deactivated state, the current limiting system 60 does not induce any impact on the current circulating in the electric power circuit 32. In the activated state, the current limiting system 60 regulates the current circulating in the electric power circuit 32.

According to one configuration, the current limiting system 60 is resettable and remains in the activated state as long as the detection system 48 determines that the blade 34.1 is in the non-contact position and returns to the deactivated state when the detection system 48 determines that the blade 34.1 has returned to the contact position.

Such a switching device 30 has the following advantages: it obviously allows the levitation phenomenon to be avoided in the event of a short-circuit, it also allows the weight and the size of such a device to be optimized and increases the reliability of the electric power circuit 32 by virtue of the reduction in the number of electronic components dedicated to the detection of a short-circuit and to the activation of the associated protection, and it also allows a switching device 30 to be designed that is adapted to each contactor 34.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A switching device comprising
at least one main contactor,
an upstream section of an electric power circuit, and
a downstream section of the electric power circuit,
the upstream section and the downstream section being positioned on either side of the main contactor,
said main contactor being configured to assume open and closed states,
a spring,
a control power supply, and
an actuator configured to cause the main contactor to change from the open state to the closed state against a force generated by the spring when the actuator is powered by a control signal generated by the control power supply that is equal to a first level,
the spring being arranged to cause the main contactor to change from the closed state to the open state when the actuator is not powered,
the main contactor comprising a blade and at least one terminal, the blade being configured to assume a position in contact with said terminal and a position not in contact with said terminal,
wherein the switching device comprises a detection system configured to determine the contact or non-contact position of the blade of the main contactor, to generate at least one second signal as a function of the determined position of the blade of the main contactor and to transmit said second signal to the control power supply,
wherein the control power supply is configured to generate a control signal configured to keep the main contactor in the closed state upon reception of the second signal, and
wherein the control power supply is configured so that the control signal is equal to the first level for a first given duration starting from the reception of a first signal and then to a second level, lower than the first level, to keep the main contactor in the closed state as long as the main contactor has to be kept in the closed state, and to a third level higher than the second level upon reception of the second signal transmitted by the detection system.

2. The switching device as claimed in claim 1, wherein the control signal is maintained at the third level as long as the detection system determines that the blade is in the non-contact position.

3. The switching device as claimed in claim 1, wherein the third level is greater than or equal to the first level.

4. The switching device as claimed in claim 1, the main contactor comprising a terminal or first and second terminals, wherein the detection system comprises at least one voltage measurement sensor configured to measure a voltage between the blade and at least one of the first and second terminals or between the first and second terminals.

5. The switching device as claimed in the claim 4, wherein the voltage measurement sensor is configured to transmit a second signal to the control power supply when the measured voltage is greater than a given voltage threshold.

6. The switching device as claimed in claim 5, wherein the voltage measurement sensor is configured to continuously transmit a second signal to the control power supply as soon as the measured voltage is greater than the given voltage threshold and until the measured voltage drops below or is equal to the given voltage threshold.

7. The switching device as claimed in claim 1, wherein the detection system comprises at least one secondary contactor connected to the blade of the main contactor, and a secondary circuit comprising said secondary contactor, the secondary contractor being configured to assume a closed state when the blade of the main contactor is in a contact position and an open state when the blade of the main contactor is in a non-contact position, with the secondary circuit being configured to generate a second signal when the secondary contactor is in the open state.

8. The switching device as claimed in claim 1, wherein the detection system comprises at least one distance measurement sensor configured to measure a distance separating said distance measurement sensor and the blade.

9. The switching device as claimed in claim 8, wherein the distance measurement sensor and the blade are separated by a given distance when the blade is in a contact position, with the distance measurement sensor being configured to transmit a second signal to the control power supply when a difference between the measured distance and the given distance is greater than a given distance threshold.

10. The switching device as claimed in claim 9, wherein the distance measurement sensor is configured to continuously transmit a second signal to the control power supply as soon as the difference between the measured distance and the given distance is greater than the given distance threshold and until the difference between the measured distance and the given distance drops below or is equal to the given distance threshold.

11. The switching device as claimed in claim 1, wherein the electric power circuit comprises a current limiting system configured to act as a function of the position of the blade determined by the detection system.

* * * * *